(12) United States Patent
Mahler et al.

(10) Patent No.: US 8,692,361 B2
(45) Date of Patent: Apr. 8, 2014

(54) ELECTRIC DEVICE PACKAGE COMPRISING A LAMINATE AND METHOD OF MAKING AN ELECTRIC DEVICE PACKAGE COMPRISING A LAMINATE

(75) Inventors: Joachim Mahler, Regensburg (DE); Edward Fuergut, Dasing (DE); Khalil Hosseini, Weihmichl (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/562,177

(22) Filed: Jul. 30, 2012

(65) Prior Publication Data

US 2014/0027892 A1    Jan. 30, 2014

(51) Int. Cl.
*H01L 23/495*    (2006.01)

(52) U.S. Cl.
USPC ............................. 257/676; 257/692; 257/693

(58) Field of Classification Search
USPC .................................. 257/676, 690, 692, 693
See application file for complete search history.

(56) References Cited

U.S. PATENT DOCUMENTS

| 2004/0195701 | A1* | 10/2004 | Attarwala | 257/783 |
| 2006/0226498 | A1* | 10/2006 | Davies | 257/409 |
| 2007/0114641 | A1* | 5/2007 | Goh et al. | 257/676 |
| 2011/0024917 | A1* | 2/2011 | Bhalla et al. | 257/777 |
| 2012/0146201 | A1* | 6/2012 | Daeche et al. | 257/676 |

* cited by examiner

*Primary Examiner* — Yu-Hsi D Sun
*Assistant Examiner* — Christina Sylvia
(74) *Attorney, Agent, or Firm* — Slater & Matsil, L.L.P.

(57) ABSTRACT

A system and method for manufacturing an electric device package are disclosed. An embodiment comprises comprising a first carrier contact, a first electric component, the first electric component having a first top surface and a first bottom surface, the first electric component comprising a first component contact disposed on the first top surface, the first bottom surface being connected to the carrier and an connection element comprising a second electric component and an interconnect element, the connection element having a connection element top surface and a connection element bottom surface, wherein the connection element bottom surface comprises a first connection element contact and a second connection element contact, and wherein the first connection element contact is connected to the first component contact and the second connection element contact is connected to the first carrier contact. The packaged device further comprises an encapsulant encapsulating the first electric component.

17 Claims, 10 Drawing Sheets

ELECTRIC DEVICE PACKAGE COMPRISING A LAMINATE AND METHOD OF MAKING AN ELECTRIC DEVICE PACKAGE COMPRISING A LAMINATE

TECHNICAL FIELD

The present invention relates generally to a packaged electric device, and particularly to a packaged power semiconductor device comprising a laminated package as a connection clip.

BACKGROUND

The necessity to provide smaller, thinner, lighter, cheaper electronic systems with reduced power consumption, more diverse functionality and improved reliability has driven a stream of technological innovations in all technical fields involved. This is certainly also true for the areas of assembly and packaging which provide protective enclosure against mechanical and thermal outside influences, as well as chemical or irradiation-induced attacks.

SUMMARY OF THE INVENTION

In accordance with an embodiment a packaged device comprises a carrier comprising a first carrier contact, a first electric component, the first electric component having a first top surface and a first bottom surface, the first electric component comprising a first component contact disposed on the first top surface, the first bottom surface being connected to the carrier and a connection element comprising a second electric component and an interconnect element, the connection element having a connection element top surface and a connection element bottom surface, wherein the connection element bottom surface comprises a first connection element contact and a second connection element contact, and wherein the first connection element contact is connected to the first component contact and the second connection element contact is connected to the first carrier contact. The packaged device further comprises an encapsulant encapsulating the first electric component.

In accordance with an embodiment a packaged semiconductor device comprises a leadframe comprising a first lead, a second lead, a third lead and a fourth lead. The packaged semiconductor device further comprises a first semiconductor device comprising a first top surface and a first bottom surface, the first semiconductor device comprising a first device contact and a second device contact on the first top surface and a third device contact on first bottom surface, and a laminated package comprising a interconnect element and a second semiconductor device, the laminated package having a top package surface and a bottom package surface, wherein a first package contact and a second package contact are disposed on the bottom package surface, and wherein a third package contact and a fourth package contact are located on the top package surface, the first package contact and the second package contact are connected by the interconnect element. The packaged semiconductor device finally comprises a first wire or conductive clip, a second wire or conductive clip, a third wire or conductive clip, and an encapsulating material encapsulating the first semiconductor device, wherein the first package contact is connected to the first lead, wherein the second package contact is connected to the first device contact, wherein the third package contact is connected to the third lead via the first wire or conductive clip, wherein the fourth package contact is connected to the fourth lead via the second wire or conductive clip, and wherein the second device contact is connected to the second lead via the third wire or conductive clip.

In accordance with an embodiment a packaged semiconductor device comprises a leadframe comprising a first lead, a second lead, and a third lead, and a first semiconductor device comprising a first top surface and a first bottom surface, the first semiconductor device further comprising a first device contact and a second device contact disposed on the first top surface and a third device contact disposed on the first bottom surface. The packaged semiconductor device further comprises a laminated package comprising a interconnect element and a second semiconductor device, the laminated package having a top package surface and a bottom package surface, wherein a first package contact, a second package contact and a third package contact are disposed on the bottom package surface. The packaged semiconductor device finally comprises a first wire or conductive clip and a second wire or conductive clip, wherein the first package contact is connected to the first lead, wherein the second package contact is connected to the first device contact, wherein the third package contact is connected to the second lead via the first wire or conductive clip, and wherein the second device contact is connected to the third lead via the second wire or conductive clip.

In accordance with an embodiment a method of manufacturing a packaged electric component comprises placing a first electric component with a first bottom surface on a carrier, the first bottom surface being opposite a first top surface, the first electric component having a first component contact on the first top surface. The method further comprises electrically connecting a first carrier contact of the carrier with the first component contact of the first electric component through a first package contact and a second package contact disposed on a bottom side of a laminated package comprising a second electric component, and encapsulating the first electric component.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENT

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be descried in a specific context, namely as a packaged half-bridge circuit comprising two power semiconductor transistors. However, embodiments of the present invention may also be applied to other device types of circuits and devices such as logic or memory devices, optoelectronic devices, MEMS, sensors, or integrated circuits.

Figure 1:
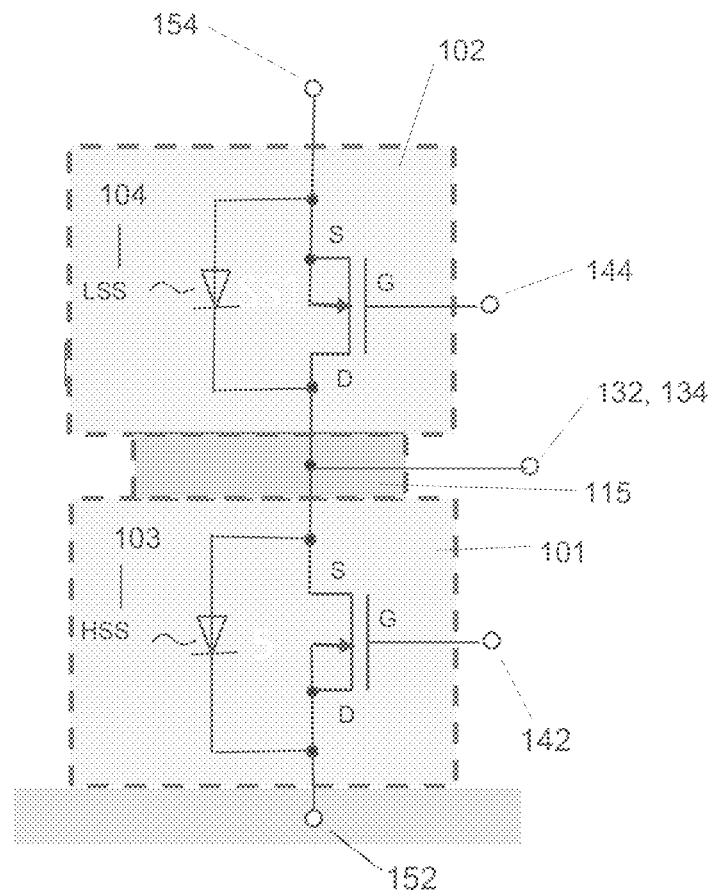
FIG. 1 illustrates a schematic of a half-bridge circuit.
Figure 2:
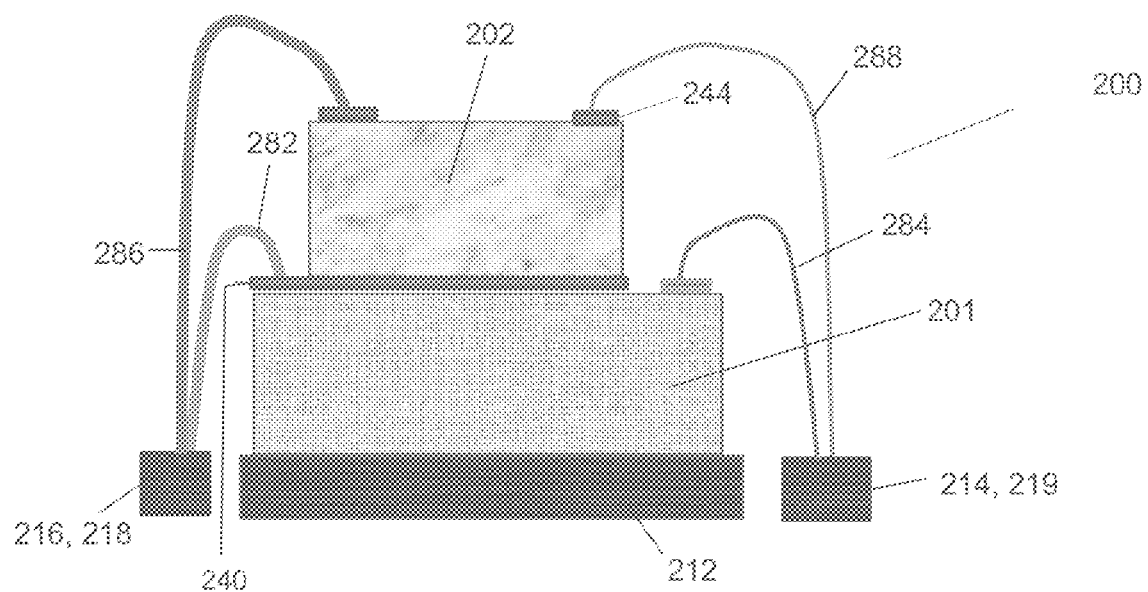
FIG. 2 illustrates a conventional system of two power semiconductor devices interconnected to a half-bridge circuit.

FIGS. 1-3 show conventional half-bridge circuit arrangements using power semiconductor transistors. FIG. 1 shows an exemplary schematic half-bridge circuit comprising a series-connection of a first semiconductor device 101 having a high-side power switch (HSS) 103, and a second semiconductor device 102 having a low-side power switch (LSS) 104. The half-bridge circuit comprises terminal contacts 132, 134, 142, 144, 152, 154 connected to source, gate and drain contacts of the power switches 103, 104. The switching in the power switches 103,104 is controlled by the voltages applied to gate contacts 142, 144.

A half-bridge circuit is typically not integrated into one substrate because the corresponding footprint would be too large. Rather, the individual power switches of the half-bridge circuit are stand-alone devices which are packaged together in a single package. FIG. 2 shows a cross-sectional view of such a conventional half-bridge circuit. The half-bridge 200 comprises a first power switch 201 disposed on a leadframe 212 to which the switch 201 is mechanically and electrically connected. The leadframe 212 comprises leads 214, 216, 218, 219. The half-bridge circuit further comprises a second power switch 202 which is disposed on the first power switch 201. A connection layer 240 provides a mechanical and electrical connection between the first power switch 201 and the second power switch 202. The first power switch 201 and the second power switch 202 are electrically connected through wires 282, 284, 286, 288 to the leads 214, 216, 218, 219.

Figure 3A:
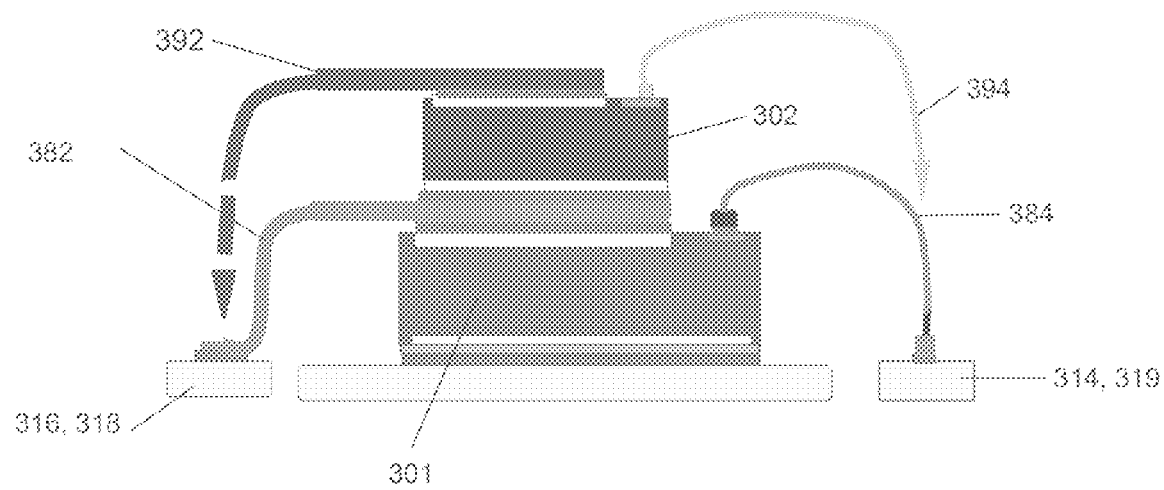
FIGS. 3a and 3b illustrate another conventional system of two power semiconductor devices interconnected to a half-bridge circuit.
Figure 3B:
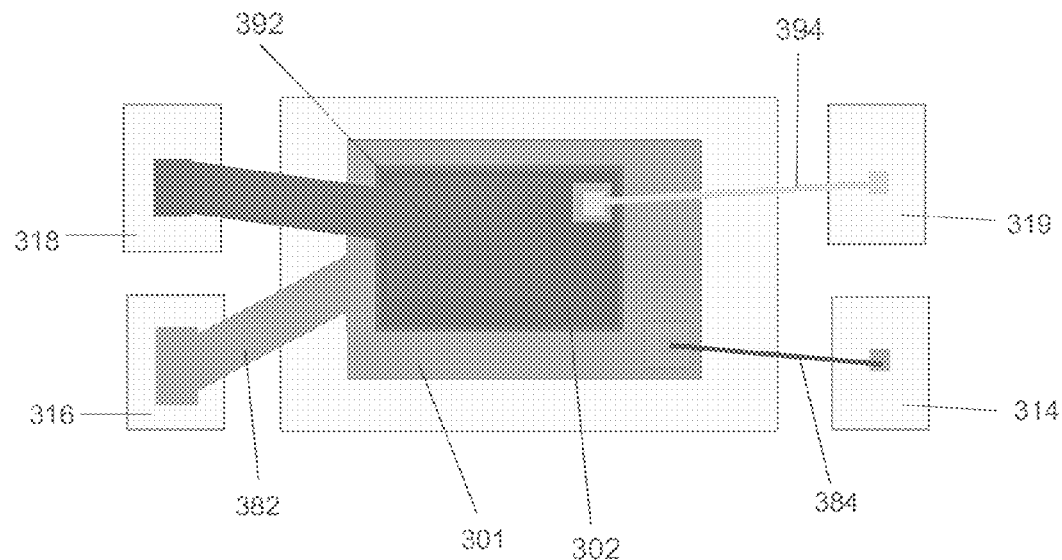

FIGS. 3*a* and 3*b* illustrate another conventional half-bridge circuit. The two power switches 301, 302 are connected in series. The two switches 301, 302 are connected to the leads through a combination of wires and clips. The clips 382, 392 connect the power devices 301, 302 with leads 316, 318 and the wires 384, 394 connect the power devices 301, 302 with leads 314, 319. Using the clips 282, 292 instead of wirebonds decrease the resistivity of the system because of the significantly larger cross-sections of the clips compared to the wirebonds.

A common problem with the conventional packaged electric devices is the size of the package.

An embodiment of the invention provides a laminated package as an electrical connection element between a component contact of a first electric component and a carrier contact of a carrier. A second component may be embedded in the laminated package. A package contact of the laminated package may be connected via a connecting element to a further carrier contact. In one embodiment the laminated package comprises a prepreg material. An advantage of embodiments of the invention provides a further reduction in package and footprint size. Another advantage is a further reduction in overall electric path lengths of interconnects since longer interconnects may cause capacitive losses, inductive losses, higher power consumption and signal latencies.

Figure 4:
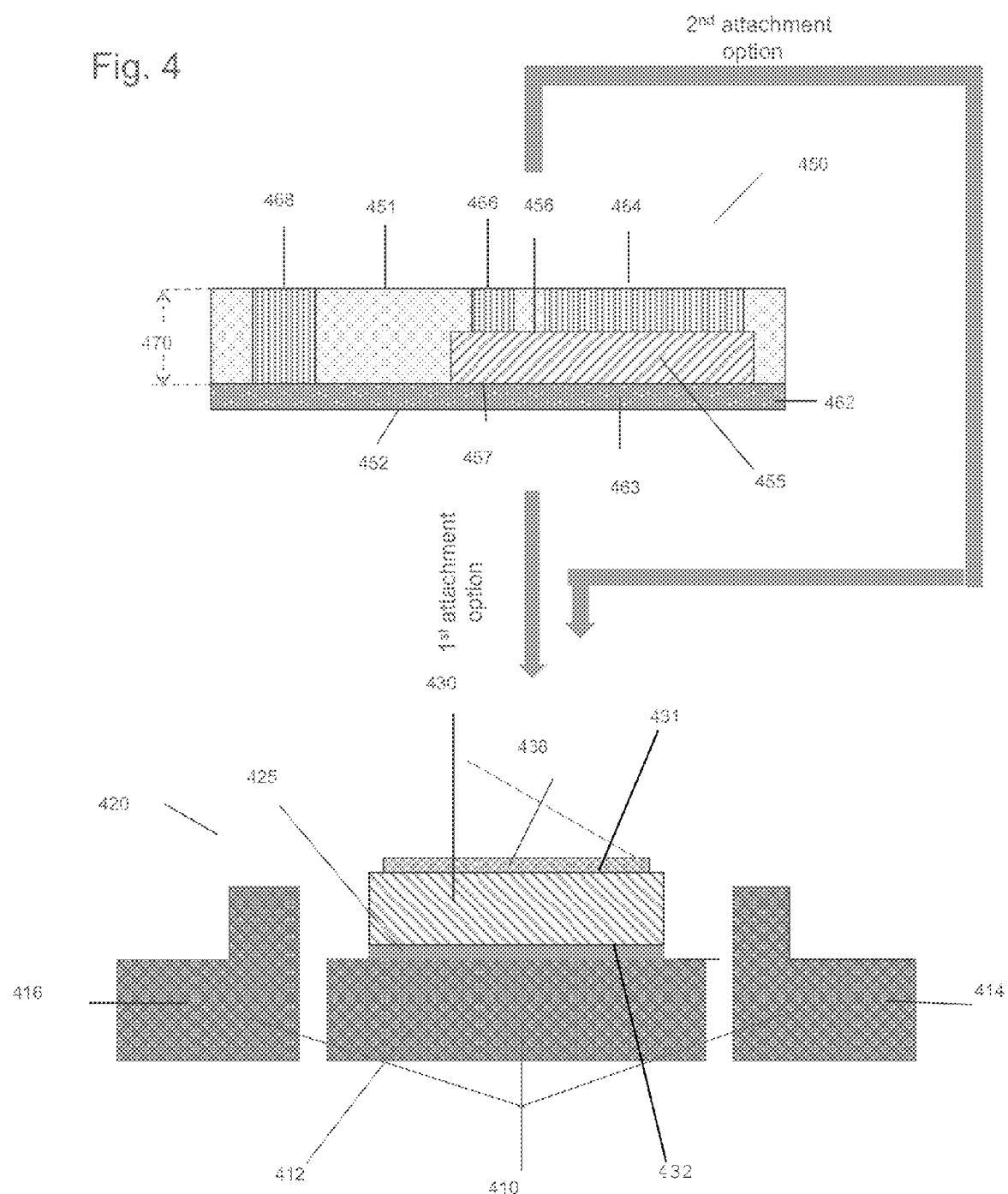
FIG. 4 illustrates a cross-sectional view of an embodiment of how to connect a packaged electric device comprising a first device with a laminated package clip embedding a second electric device.

FIG. 4 shows an embodiment of the invention in a stage before the connection element 450 is attached to the component device 420. There is a first option and a second option to attach the connection element 450 to the component device 420. The assembled system, the packaged electric device comprises the component device 420, the connection element 450 and an encapsulating material encapsulating the component device 420. Embodiments of such assembled systems are discussed with respect to FIGS. 5-9.

The component device 420 comprises a carrier and a first component 430 such as a chip (or die). The first component 430 comprises a substrate. The substrate may be a semiconductor substrate such as silicon or germanium, or a compound substrate such as SiGe, GaAs, InP, GaN or SiC, or alternatively other materials. The semiconductor substrate may be a single crystal silicon or a silicon-on insulator (SOI). One or more interconnect metallization layers may be arranged on the substrate. A passivation layer is disposed on the top surface of the interconnect metallization layers to electrical isolate and structured component contacts. The passivation layer may comprise SiN, for example. The first component 430 comprises a top surface or first main surface 431 and bottom surface or second main surface 432. The first component 430 may be a system on chip (SoC).

The first chip 430 may comprise a discrete device such as a single semiconductor device or an integrated circuit (IC). For example, the first chip 430 may comprise a power semiconductor device such as a bipolar transistor, an insulated gate bipolar transistor (IGBT), a power MOSFET, a thyristor or a diode. Alternatively, the first chip 430 may be a component such as a resistor, a protective device, a capacitor, a sensor or a detector, for example.

The first component 430 has a first component contact or first component contact pad disposed on the first main surface 431. The first component 430 may further comprise a second component contact or second component contact pad on the first main surface 431. The first component 430 may finally comprise a third component contact or third component contact pad on the first main surface 431 or the second main surface 432. Alternatively, the first component 430 may have other contact pad arrangements on its first and second main surfaces 431, 432.

In one embodiment, the carrier 410 is a leadframe. The leadframe 410 may comprise leadframe contact pads or leads 414 and 416 and a die attach region 412. The leadframe contact pads 414, 416 are configured to be electrically connected to the component contact pads and the die attach region 412 is configured to receive the first component 430. The leadframe 410 may comprise a conductive material such as a metal. For example, the leadframe 410 may comprise copper and/or nickel.

In other embodiments, the carrier 410 is a substrate or a printed circuit board (PCB). The carrier 410 may comprise carrier contact pads 414, 416 and a component placement area 412.

The first component 430 is attached to the carrier 410 at the component placement area 412. For example, the second main surface 432 of the first component 430 is attached to the top surface of the carrier 410. The first component 430 is attached with a die attach connection 425. For example, the second main surface 432 is bonded to the top surface of the carrier 410 using a eutectic bonding or an epoxy bonding. Alternatively, the second main surface 432 is bonded or glued to the top surface of the carrier 410 using an adhesive tape, a solder paste or a solder. Depending on the specific configuration the die attach connection 425 may be an electrical connection or may be an insulating barrier.

The contact (contact pad) or contacts (contact pads) on the first main surface 431 of the first component 430 are connected to a carrier contact pad or carrier contact pads 414, 416 by using the connection element 450.

The component package 450 comprises a package top surface or a package first main surface 451 and a package bottom surface or a package second main surface 452. The component package 450 may be attached to the component device 420 with the first main surface 451 or the second main surface 452 according to a desired configuration.

In one embodiment the component package 450 comprises a laminate 470 as encapsulation material. The laminate 470 may comprise alternating layers of conducting and non-conducting (insulating) materials. The insulating material may comprise prepreg which is a porous glass fiber film. The prepreg may be impregnated with bisphenol-A resin and hardener components. The conductive materials may comprise metals or metal alloys. For example, the conductive materials may be copper (Cu) or aluminum (Al).

The laminate 470 comprises a plurality of material layers. For example, a laminate comprises conductive (comprising conductive path and traces) and non-conductive layers is a comprising a polymeric material(s) reinforced with glass or carbon fibers and sometimes additionally filled with inorganic particles such as $SiO_2$, $Al_2O_3$ or similar materials. Each layer comprises a thickness of about 10 µm to about 1,000 µm. Alternatively, the component package 450 may comprise other encapsulation materials.

The component package 450 may comprise a second component 455 which is a chip (or die), for example. The second component 455 comprises a substrate. The substrate may be a semiconductor substrate such as silicon or germanium, or a compound substrate such as SiGe, GaAs, InP or GaN, SiC, or alternatively other materials. The semiconductor substrate may be a single crystal silicon or a silicon-on insulator (SOI). One or more interconnect metallization layers may be arranged on the substrate. A passivation layer is disposed on the top surface of the metallization layers defining component contacts or component contact pads. The passivation layer may comprise SiN, for example. The second component 455 comprises a second top surface 456 and a second bottom surface 457. The second component 455 may be a system on chip (SoC).

The second chip 455 may comprise a discrete device such as a single semiconductor device or an integrated circuit (IC). For example, the second chip 455 may comprise a power semiconductor device such as a bipolar transistor, an insulated gate bipolar transistor (IGBT), a power MOSFET, a thyristor or a diode. Alternatively, the second chip 455 may be a component such as a resistor, a protective device, a capacitor, a sensor or a detector, for example.

The second component 455 has a first component contact or first component contact pad disposed on the second top surface 456. The second component 455 may further comprise a second component contact or second component contact pad on the second top surface 456. The second component 455 may finally comprise a third component contact or third component contact pad on the second top surface 456 or the second bottom surface 457. Alternatively, the first component 430 may have other contact pad arrangements on its second top and bottom surfaces 456, 457.

The component package 450 may comprises an interconnect element 462. The interconnect element 462 may be a conductive interconnect, a conductive trace, a conductive redistribution layer, or a second carrier. The connection element 450 may comprise second component package contacts 464, 466, 468 connected to the component contacts of the second component 455.

In one embodiment, the interconnect element 462 is a leadframe. The leadframe 462 may comprise leadframe contact pads or leads and a component attach region 463. The leadframe 462 may comprise a conductive material such as a metal. For example, the leadframe 462 may comprise copper and/or nickel.

The second component 455 is attached to second leadframe 462 at the die attach area 463. For example, the second bottom surface 457 of the second component 455 is attached to the top surface of the leadframe 462. The second component 455 is attached with a die attach connection. For example, the second main surface 457 is bonded to the top surface of the leadframe 462 using a eutectic bonding or an epoxy bonding. Alternatively, the second main surface 457 is bonded, glued, soldered by diffusion soldering or connected by a nano paste to the top surface of the leadframe 462 using an adhesive tape, a solder paste or a solder. Depending on the specific configuration the component attach connection may be an electrical connection or may be an insulating barrier.

In one embodiment, the second component 455 is a power semiconductor switch or a transistor having a source contact and a gate contact at the second top surface 456 and the drain contact at the second bottom surface 457. The gate contact of the power semiconductor switch is connected to the component package contact 466 via a trace in the laminate 470, the source contact of the power semiconductor switch is connected to the component package contact 464 via a trace in the laminate 470 and the drain contact of the power semiconductor switch is connected to the component package contact 468 via the leadframe 462 and a through-hole connection through the laminate 470.

As shown in FIG. 4 by arrows, the component package 450 may be attached to the device 420 with the upper or first main package surface 451 or with the lower or second main package surface 452. In one embodiment the component package can connect two component contacts of the component device 420 to two carrier contacts 416, 414 of the carrier 410.

Figures 5A, 5B:
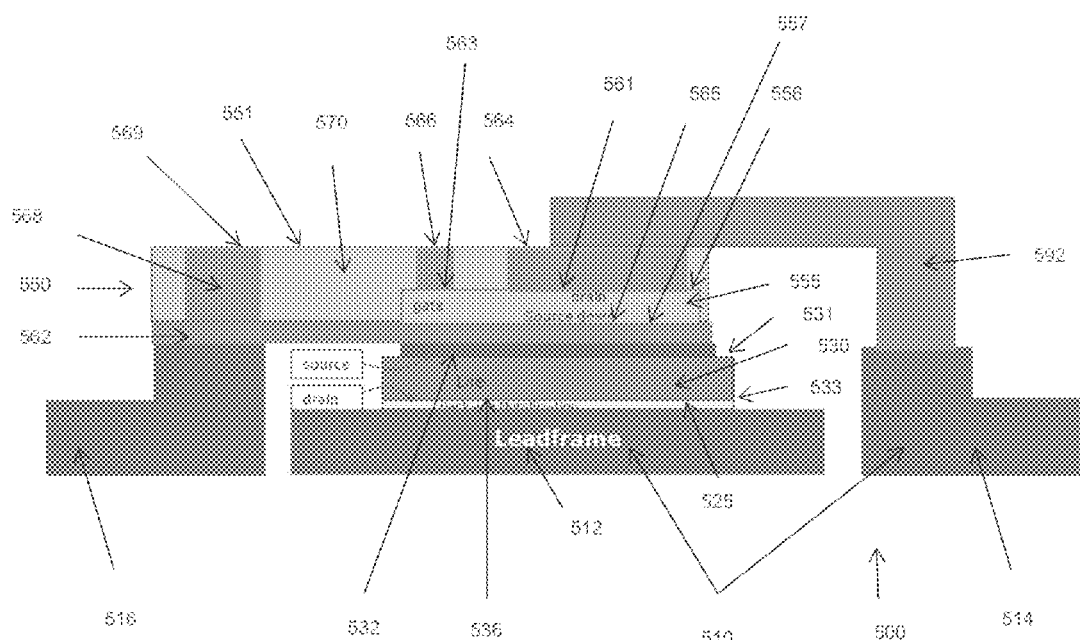
FIGS. 5a and 5b illustrate a cross-sectional view and a top view of an embodiment of a packaged electric device comprising a first device and a laminated package clip embedding a second electric device.

FIGS. 5a and 5b show an embodiment of a packaged electric device 500. The packaged electric device may be a half-bridge circuit. The packaged electric device comprises a first component such as power transistor chip 530 and an connection element 550 comprising a second component such as a second power transistor chip 555. The first component 530 is mechanically and electrically connected to a carrier contact 516 through the connection element 550.

FIGS. 5a and 5b shows an embodiment of an electric component package 500 (e.g., a half-bridge circuit). The first component 530 of the electric component package comprises a first contact 532 such as a source contact and a second contact 539 such as gate contact on the upper or first main surface 531 and a third component contact 536 such as the drain contact on the lower or second main surface 533. The third component contact (e.g., drain contact) 536 is mechanically and electrically connected to a die attach region 512 of the carrier 510 such as a metallic leadframe via a backside metallization (BSM) layer 525. The BSM layer 525 may comprise barrier layers such as Cr, Ti or Ta layers which protect the first component 530 against undesired metal atom diffusion into the component, and a layer (or a stack of layers) of metals such as Au, Ag or Cu layers which may exhibit a high coefficient of diffusion into the metallic leadframe 510. The second contact 539 is connected to the carrier contact 519 (e.g., lead) through a wire or a conductive clip (e.g., metallic clip) 584. In one particular example, the second contact 539 is connected to the lead 519 through a wire 584. The wire 584 may be connected to the second contact 539 and the lead 519 via a ball bonding process, a wedge bonding process, a strip bonding process, a ribbon bonding process or a combination thereof.

The first component contact 532 of the component 530 is connected to the carrier contact 516 through the connection element 550. The connection element 550 comprises a second component 555 such as a second power transistor chip, an interconnect element 562 such as a conductive interconnect, conductive trace, redistribution layer or a leadframe, and a encapsulation material (e.g., laminate). The second component comprises a first contact 561 such as the drain contact and a second contact 563 such as the gate contact on the second top surface 556 of the second component 555 and a third contact 565 such as the source contact on the second bottom surface 557 of the second component 555. The interconnect element 562 of the connection element 550 provides multi-fold functionality.

The interconnect element 562 is electrically connected to the first component contact 532 (e.g., source contact) of the first component 530 and the third contact 565 (e.g., source contact) of the second component 555. Moreover, the interconnect element 562 provides a conductive connection (functions as an internal or embedded clip) between the component contacts 532, 565 and the carrier contact (e.g., lead) 516. Finally, the interconnect element 562 together with the through-hole 568 establishes a conductive path to the package contact 569 located on the top package surface or main package surface 551 of the connection element 550 thereby providing an interconnection route to external circuits.

The first component contact 561 of the second component 555 is electrically connected to the carrier contact (e.g., lead) 514 through the component package contact 564 and the second component contact 563 of the second component 555 is electrically connected to the carrier contact (e.g., lead) 518 through the component package contact 566. The first and second component contacts 561, 563 are connected to carrier contacts 514, 518 though connecting elements (e.g., wires or conductive clips) 592, 594. In one example, the wires 592, 594 may be connected between the contacts 561, 563 and the leads 514, 518 using a ball bonding process, a wedge bonding process, a strip bonding process, a ribbon bonding process or a combination thereof or conductive clip, for example. In one particular example, the connecting element 594 comprises a wire and the connecting element 592 comprises a clip.

The electric component package 500 may further comprise an encapsulant (not shown). The encapsulant encapsulates the first component 530 with an encapsulation material. The encapsulant may further encapsulate (or partially encapsulate) the connection element 550, the connecting elements 584, 592, 594 and the carrier 510.

The encapsulation material of the encapsulant may be a molding compound or a laminate. In one embodiment the encapsulation material may be a different material than the encapsulation material of the connection element 550. For example, the encapsulation material of the connection element 550 may be a laminate and the encapsulation of the encapsulant may be a molding compound.

The encapsulation material of the encapsulant may comprise thermosetting materials such as an epoxy, polyurethane or polyacryliate compound. Alternatively the encapsulation material may comprise thermoplastic materials such as polysulfones, polyphenylen sulfides, or polyetherimides. In one example, the encapsulation 210 may comprise a polyimide such as a Si-modified polyimide.

Since the electric component package 500 may provide modular characteristics several extended configurations are possible. For example, a third component may be disposed on the electric component package 500 by attached the third component to a flat region of the connecting element 592. In another example, a heat sink may be disposed on the top surface of the embedded package 550 promising effective and improved heat management.

Figure 6A:
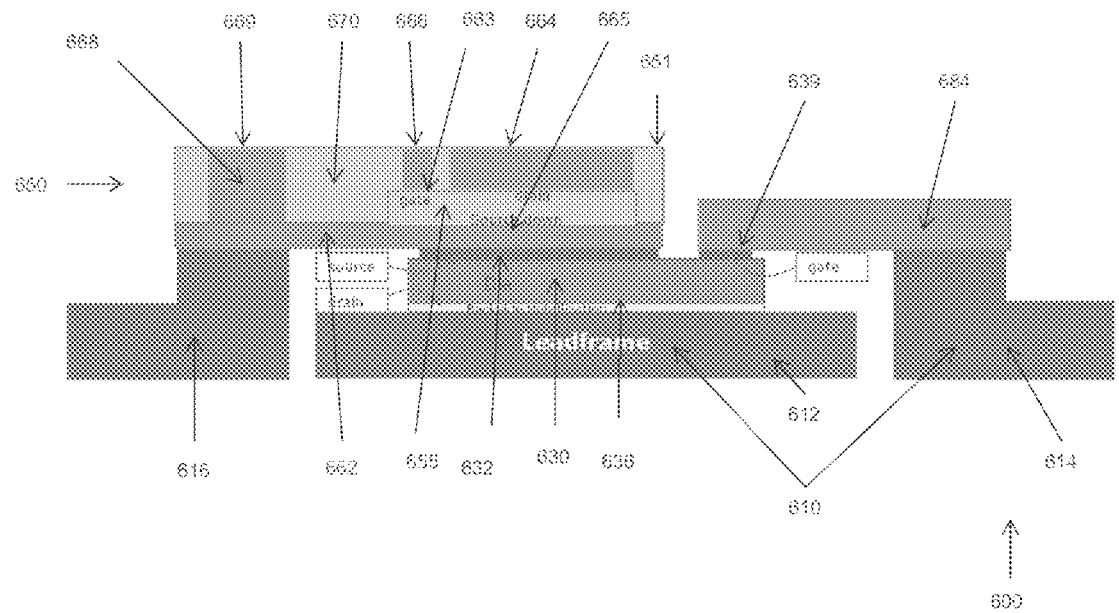
FIGS. 6a and 6b illustrate a cross-sectional view and a top view of another embodiment of a packaged electric device comprising a first device and a laminated package clip embedding a second electric device.
Figure 6B:
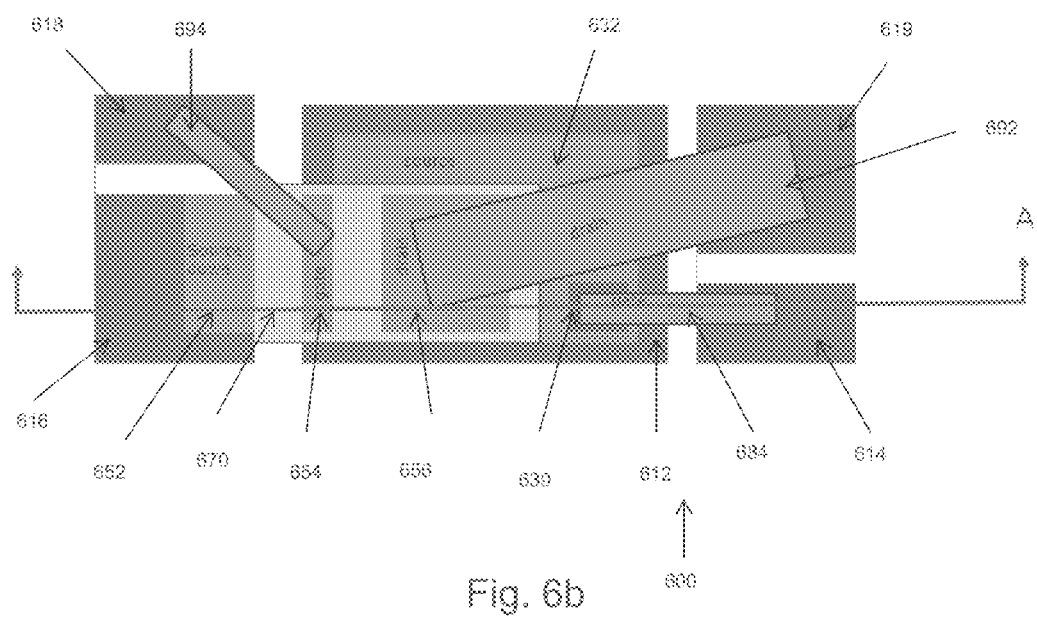

FIGS. 6a and 6b show a further embodiment of s packaged electric device 600 (e.g., a half-bridge circuit). The packaged electric device 600 comprises a first component (e.g., a power transistor chip) 630 and an connection element 650 including a second component (e.g., power transistor chip) 655. The elements of FIGS. 6a and 6b are the same or are similar as the elements of FIGS. 5a and 5b except for the first digit in the number. Again, the first component contact 632 such as the source contact of the first component 630 and the third contact 665 such as the source contact of the second component (e.g., power transistor chip) 655 are in electrical contact with the interconnect element 662 of the connection element 650.

Further, the interconnect element 662 provides an electrical connection between the component contacts 632/665 and the carrier contact 616. In this embodiment the size of the connection element (e.g., laminated package) 650 is comparatively smaller than the connection element (e.g., laminated package) 550 in the embodiment of FIGS. 5a/5b. This allows placing a second component contact such as a gate contact 639 adjacent a short side of the connection element 650 whereas the corresponding second contact 539 of the embodiment in FIG. 5b is positioned behind or adjacent a long side of the connection element 550. As a result, connecting elements 684, 692 are arranged differently compared to connecting elements 584, 592. In particular, connecting element 692 connects the component contact such as the drain contact of the second component 655 to carrier contact 619 while connecting element 684 connects the second component contact 639 such as the gate contact to carrier contact 614. Accordingly, the connection elements 550, 650 provide flexible solutions with respect to designs of architectures of the integrated systems 500, 600. For example, the systems 500, 600 may be optimized to minimize capacitive and/or inductive losses. Moreover, the systems 500, 600 are not limited to half-bride circuits and may be configured for various applications.

Figure 7A:
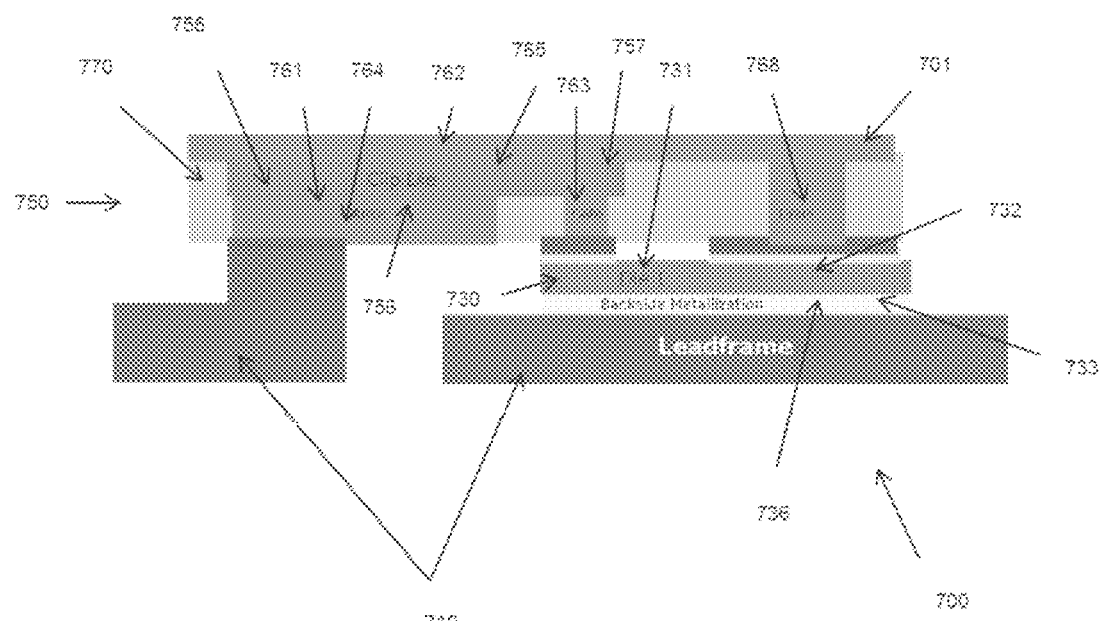
FIGS. 7a and 7b illustrate a cross-sectional view and a top view of yet another embodiment of a packaged electric device comprising a first device and a laminated package clip embedding a second electric device.
Figure 7B:
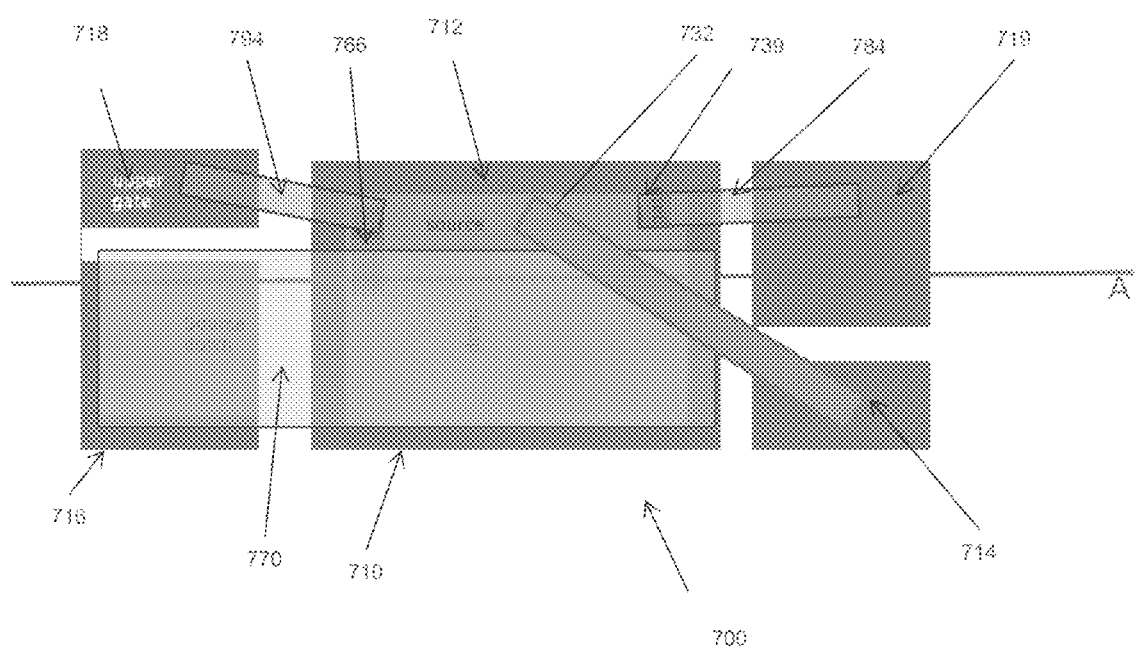

FIGS. 7a and 7b show an embodiment of a packaged electric device 700. The packaged electric device may be a half-bridge circuit. The packaged electric device comprises a first component such as power transistor chip 730 and an connection element (e.g., laminated package) 750 comprising a second component such as a second power transistor chip 755. The first component 730 is mechanically and electrically connected to a carrier contact 716 through the connection element 750.

FIGS. 7a and 7b further shows that the first component 730 comprises a first component contact 732 such as a drain contact and a second component contact 739 such as gate contact on the top surface 731 of the chip 730 and a third component contact 736 such as the source contact on the bottom surface 733 of the chip 730 while the second component 755 comprises a first component contact 761 such as the source contact and a second component contact 763 such as the gate contact on the second bottom surface 756 and a third component contact 765 such as the drain contact on second top surface 757.

The third component contact (e.g., source contact) 736 of the first component 730 is mechanically and electrically connected to a top surface of the carrier 710. The second component contact 739 is connected to the carrier contact 719 though a connecting element 784, wherein the connecting element 784 comprises a wire or a conductive clip. In one particular example, the second component contact 739 is connected to the carrier contact 719 through a wire 784. The wire 784 may connect to the second component contact 739 and the carrier contact 719 via a ball bonding process, a wedge bonding process or a combination thereof.

The interconnect element 762 of the connection element 750 is electrically connected to the first component contact 732 (e.g., drain contact) of the first component 730 and the third component contact 765 (e.g., drain contact) of the second component 755. Moreover, the interconnect element 762 provides a conductive connection (functions as an internal or embedded clip) between the first component contact 732 (e.g., drain contact) of the first component 730 and the carrier contact 716. Finally, the interconnect element 762 is connected to the first component contact (e.g., drain contact) 732 of the first component 730 via through-hole 768. The interconnect element 762 is disposed on a top surface 701 of the connection element 750.

The first component contact (e.g., source contact) 761 of the second component 755 is electrically connected to the carrier contact 716 and the second component contact 763 (e.g., gate contact) is electrically connected to the carrier contact 718 via the connecting element 794. The second component contact (e.g., gate contact) 763 is routed out of the connection element 750 via interconnect 766. The interconnect 766 may be disposed on the first component 730. The connecting element 794 comprises a wire or a conductive clip. In one particular example, the second component contact (e.g., gate contact) 763 is routed to the lead 718 via an interconnect 766 of the first component 730 and through the wire 794. The wire 794 may connect to the second component contact 739 and the lead 789 via a ball bonding process, a wedge bonding process or a combination thereof. In this embodiment, only three carrier contacts 716, 718 and 719 are electrically connected. Moreover, the packaged electric device 700 provides a relatively large accessible top surface 701 which may be used for the build-up of additional devices and/or the attachment of a heat sink.

The electric component package 700 may further comprise an encapsulant (not shown). The encapsulant encapsulates the first component 730 with an encapsulation material. The encapsulant may further encapsulate (or partially encapsulate) the connection element 750, the connecting elements 784, 794 and the carrier 710.

Figure 8A:
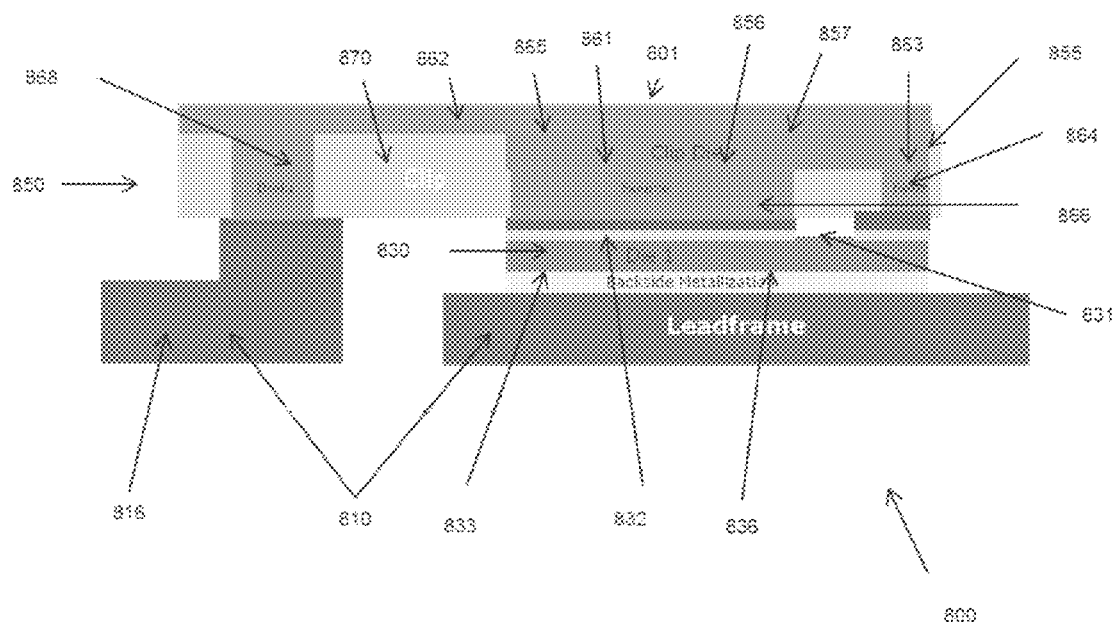
FIGS. 8*a* and 8*b* illustrate a cross-sectional view and a top view of a further embodiment of a packaged electric device comprising a first device and a laminated package clip embedding a second electric device.
Figure 8B:
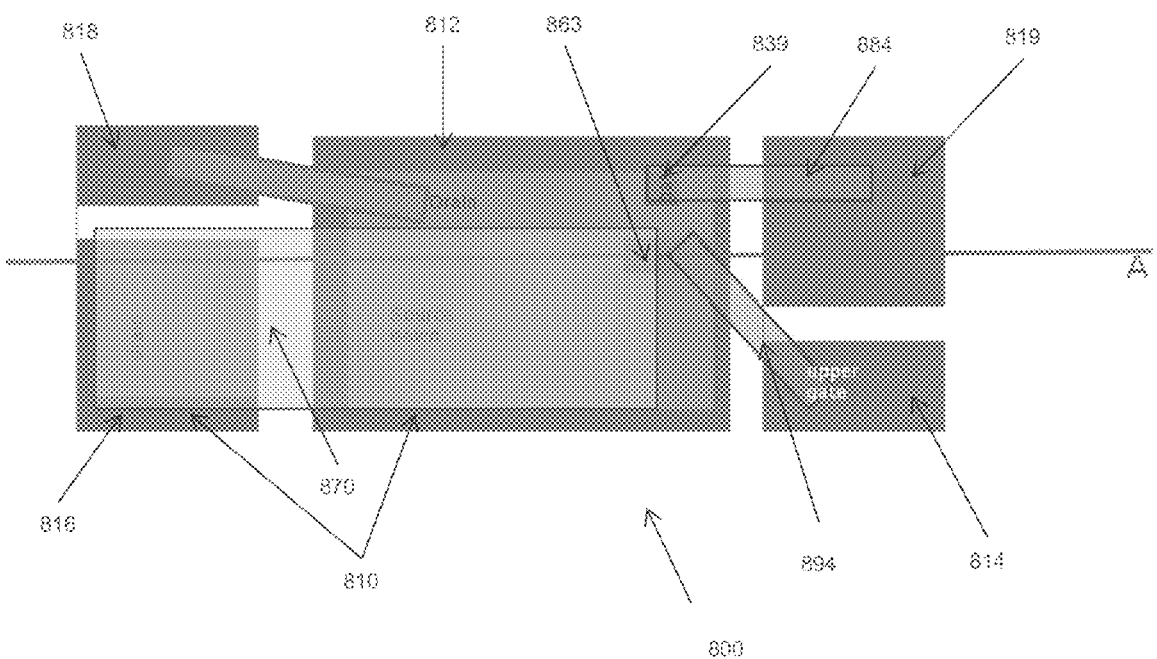

FIGS. 8a and 8b show an embodiment of a packaged electric device 800. The packaged electric device may be a half-bridge circuit. The packaged electric device comprises a first component such as power transistor chip 830 and a connection element (e.g., laminated package) 850 comprising a second component such as a second power transistor chip 855.

The first component 830 is mechanically and electrically connected to a carrier contact 816 through the connection element 850.

FIGS. 8a and 8b further show that the component 830 comprises a first component contact 832 such as a source contact and a second component contact 839 such as gate contact on the top surface 831 of the first component 830 and a third component contact 836 such as the drain contact on the bottom surface 833 of the first component 830 while the second component 855 comprises a first component contact 861 such as the source contact and a second component contact 863 such as the gate contact on the bottom surface 856 of the second component 855 and a third component contact 865 such as the drain contact on the top surface 857 of the second component 855.

The third component contact (e.g., drain contact) 836 of the first chip 830 is mechanically and electrically connected to the carrier 810. The second component contact 839 is connected to carrier contact 819 though a connecting element 884, wherein the connecting element 884 comprises a wire or a conductive clip. In one particular example, the second component contact 839 is connected to the carrier contact 819 through a wire 884. The wire 884 may connect the second component contact 839 and the carrier contact 819 via a ball bonding process, a wedge bonding process or a combination thereof.

The interconnect element 862 of the connection element 850 electrically connects third component contact 865 (e.g., drain contact) of the second component 855 to the carrier contact 816 via a through-hole 868.

The first component contact (e.g., source contact) 861 of the second component 855 is electrically connected to the first contact (e.g., source contact) 832 of the first component 830 via interconnect 866. The second component contact 863 (e.g., gate contact) of the second component 855 is electrically connected to the carrier contact 814 via the interconnect 864 and the connecting element 894. The connecting element 894 may comprise a wire or a conductive clip. In one particular example, the second component contact (e.g., gate contact) 863 is routed via the interconnect 864 of the first component 830 and the wire 894 to the carrier contact 814. The wire 894 may connect to the second component contact 863 and the carrier contact 814 via a ball bonding process, a wedge bonding process or a combination thereof. In this embodiment, only three carrier contacts 814, 816 and 819 are electrically connected. Moreover, the embodiment of the packaged electric device 800 provides a relatively large accessible top surface 801 which may be used for the build-up of additional devices and/or the attachment of a heat sink.

Figure 8C:
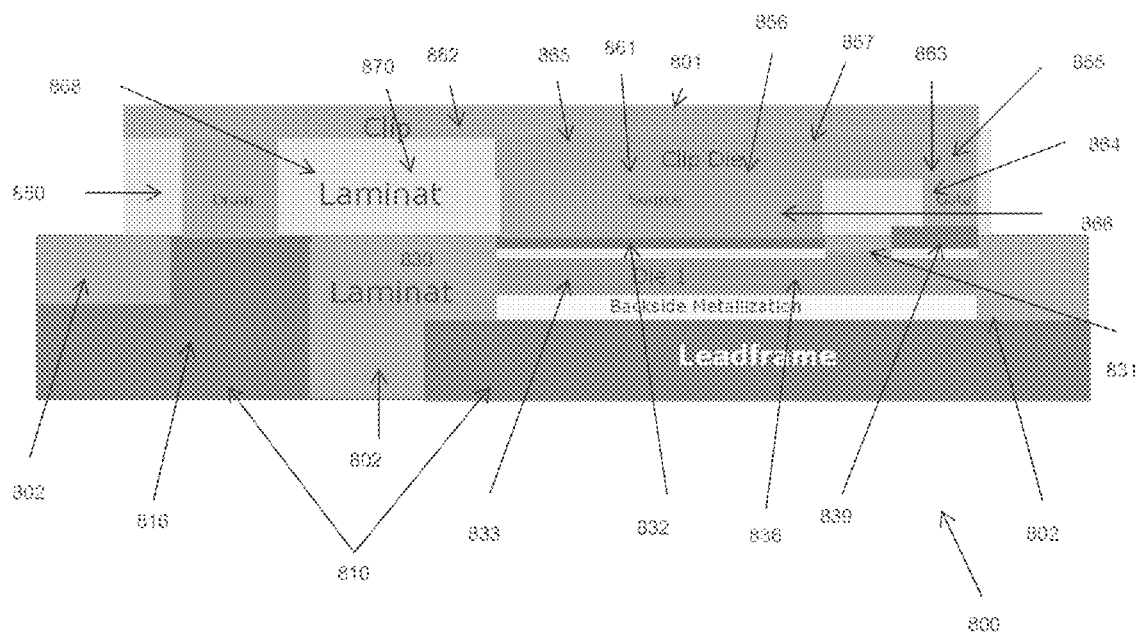
FIG. 8*c* illustrates a cross-sectional view of an embodiment of a packaged electric device comprising a first device and a laminated package clip embedding a second electric device, wherein the first device is encapsulated in a laminated package.

The electric component package 800 further comprises an encapsulant. In the embodiment of FIG. 8c the encapsulant 802 is a laminate. The laminate 802 and laminate 870 may be the same or may be different. Alternatively, the encapsulation material 802 is a molding compound.

FIG. 8c shows a specific embodiment of encapsulating the electric component of FIG. 8. However, the electric component may be encapsulated differently. For example, the encapsulation material 802 may cover the interconnect element 862.

FIG. 8c may provide an example how embodiments of FIG. 5-7 are encapsulated.

For the different embodiments of the packaged electric devices shown in FIGS. 5-8 the mechanical connection may involve bonding metal to metal surfaces. There are several methods to join metallic interfaces. In one embodiment a conductive adhesive is applied. The conductive adhesive may comprise thermoplastic or thermosetting resins (e.g. epoxy compounds, polyimides, modified silicones) which contain a large volume (up to 80%) of highly conductive flakes of Ag, Ag-plated Cu, Ni or Au. The length of the conductive flakes may be tens of μm. Conductive adhesives can be screen printed, stencil printed, dot placed or dispersed on the interface to be connected. After the application of the conductive adhesive the layers are cured for a few minutes at temperatures ranging from 100° C. to 250° C.

In another embodiment nanopaste products are employed. Nanopaste products comprise metallic inks having particles of Ag or Au which measure a few tens of nm in size. Nanopastes may be applied to a substrate by an inkjet printer. Bond formation between the contact interfaces occurs by sintering of the nanopastes (for example at 220° C.-250° C., under pressure of 1-5 MPa, for 1-2 min).

In a further embodiment solder techniques are applied. Solder materials such as Pb/Sn and Au/Sn can be used. Solder techniques may include diffusion soldering, also known as solid-liquid inter-diffusion bonding. With diffusion bonding a metallic thin-film interlayer is employed which melts at low temperatures and reacts rapidly with the metals of higher melting interface layers to form one or more intermetallic phases. These intermetallic compounds (IMCs) have distinctly higher melting points than the original low-melting interface. Thus the joint will not re-melt thereafter unless it is heated to a higher temperature at which one of the intermetallic phases melts. AuSn, AgSn, CuSn and AgIn are frequently used for diffusion soldering. Soft soldering and diffusion soldering may be carried out at temperatures of 300-400° C., or at temperatures below 350° C. In some embodiments, lower processing temperatures are desirable to better guarantee the integrity of the laminate architecture. Formation of solder connections at a temperature below 250° C. becomes possible by applying batch soldering/curing under pressure in an oven.

In one embodiment a Reactive Nano Technology (RNT) bonding may be applied to join two metallic interfaces in the presence or absence of a solder material. RNT bonding relies on the presence of 1-30 nm thick reactive nanoscale bilayers of alternating elements like Ni/Al, Al/Ti or Ti/a-Si. A self-propagating exothermic intermixing process between the different metals in the nanostack may be ignited at the periphery of the reactive layer by a local heat pulse, a laser pulse or an electrical pulse. The heat released by the exothermic reaction induces inter-diffusion processes between the metallic faces to be joined. Applying a bonding pressure of a few MPa, bonding of contact faces may occur within milliseconds. The heat created by the self-propagating reaction remains localized close to the contact interface and does not penetrate too much into the bulk of the metallic counter-faces to be joined.

In one embodiment Nanovelcro technology may be applied to bond metallic interfaces without applying a solder. With this bonding technique thin layers comprising conductive carbon nanotubes are applied to the contact interfaces to be joined. The two contact layers are enmeshed under pressure forming electrical and mechanical contacts without the application of solder.

Figure 9:
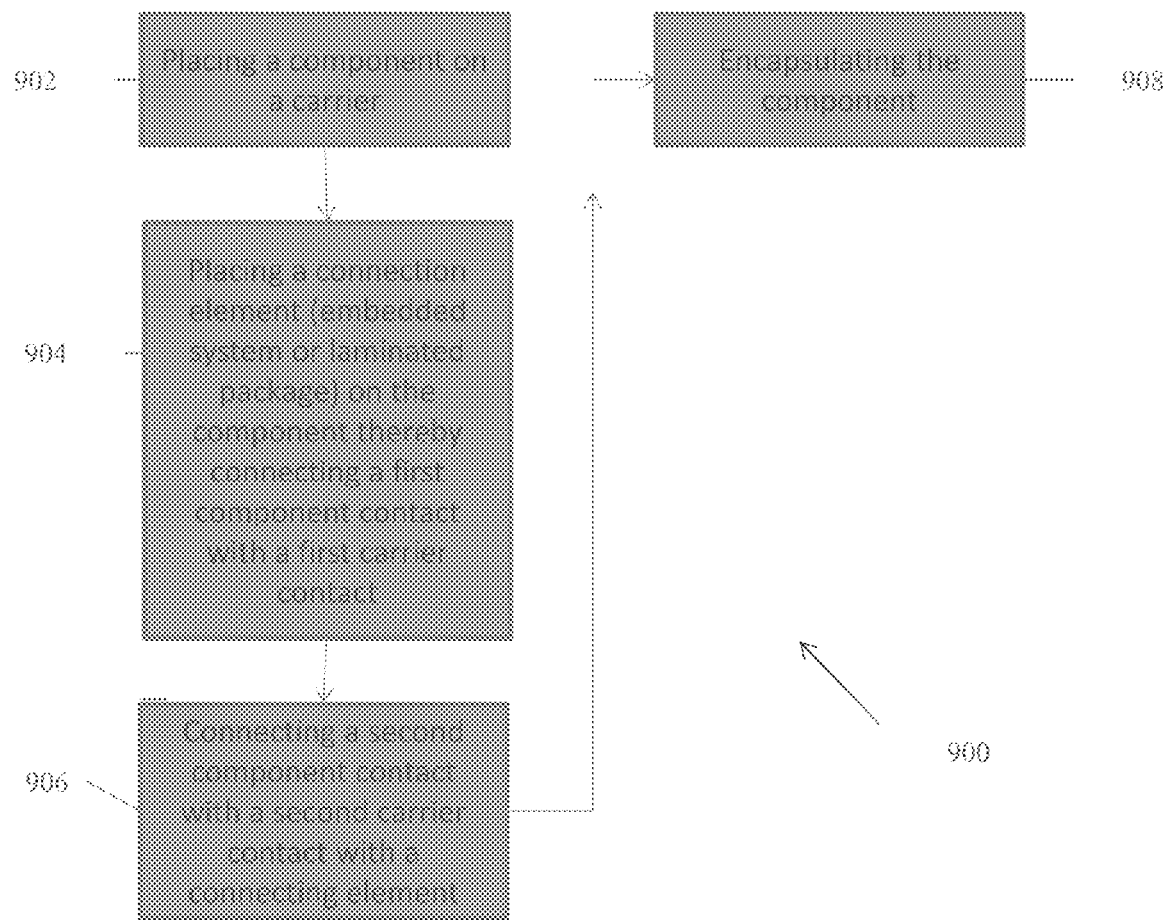
FIG. 9 illustrates an embodiment of a method of manufacturing a packaged electric device comprising the laminated package clip.

FIG. 9 shows an embodiment of a method of making a packaged electric device 900. In a first step 902, a component is placed on a carrier. The component may be a semiconductor chip. For example, the semiconductor chip may be a power semiconductor device such as a bipolar transistor, an insulated gate bipolar transistor (IGBT), a power MOSFET, a thyristor or a diode. Alternatively, the component may be a resistor, a protective device, a capacitor, a sensor or a detector, for example. The carrier may be a leadframe, a substrate or a printed circuit board. For example, the leadframe may comprise copper and/or nickel.

The component may be electrically bonded to the carrier using a solder, a solder past, a conductive resin or a conductive tape. Alternatively, the component is bonded to carrier using an insulating bonding. The insulating bonding may comprise an epoxy or resin bonding or an adhesive tape. The component attach connection may be an insulation barrier.

In step 904, a connection element is placed on the component thereby connecting a first component contact on a top surface of the component with a first carrier contact. The connection element may comprise a further component such as a semiconductor chip. For example, the semiconductor chip may be a power semiconductor device such as a bipolar transistor, an insulated gate bipolar transistor (IGBT), a power MOSFET, a thyristor or a diode. Alternatively, the component may be a resistor, a protective device, a capacitor, a sensor or a detector, for example. The component may be embedded in the laminated package.

The connection element may comprise several contacts. The connection element may comprise interconnects, conductive traces and through-holes to connect the first component contact with the first carrier contact and the further component embedded in the laminated package. The first component contact and the first carrier contact may be electrically bonded to the laminated package using a solder, a solder past, a conductive resin or a conductive tape.

In one embodiment the connection element may connect a first component contact to a first carrier contact and a second carrier contact. Moreover, the connection element may connect a first component contact to a first carrier contact and a second component contact to a second carrier contact.

In step 906 a second component contact and/or an optional third component contact is connected with a second carrier contact and/or an optional third carrier contact using connecting elements. The connecting element may comprise a wire or a metallic clip. In one particular example, the second component contact and/or the third component contact are connected to their respective carrier contacts through a wire or wires. The wires are bonded using a ball bonding process, a wedge bonding process, a strip bonding process, a ribbon bonding process or a combination thereof.

In the final step 908, the component is sealed or encapsulated with an encapsulation material. The encapsulation material may comprise a molding compound, a laminate or a casing. The encapsulation material may partially encapsulate the carrier and completely encapsulate the component. The encapsulation material may completely or partially encapsulate the connecting elements. Moreover the encapsulation material may completely or partially encapsulate the connection element. For example, a bottom main surface of the connection element is encapsulated while a top main surface is not encapsulated with the encapsulation material. In one embodiment the encapsulation material and the laminate material of the connection element are different. Alternatively, the encapsulation material and the laminate material of the connection element are the same.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A packaged device comprising:
a carrier comprising a first carrier contact;
a first electric component, the first electric component having a first top surface and a first bottom surface, the first electric component comprising a first component contact disposed on the first top surface, the first bottom surface being connected to the carrier;
a connection element comprising a second electric component and an interconnect element, the connection element having a connection element top surface and a connection element bottom surface, wherein the connection element bottom surface comprises a first connection element contact and a second connection element contact, and wherein the first connection element contact is connected to the first component contact and the second connection element contact is connected to the first carrier contact; and
an encapsulant encapsulating the first electric component.

2. The packaged device according to claim 1, further comprising
the carrier having a second carrier contact;
the first electric component having a second component contact on the first top surface; and
a first connecting element connecting the second component contact with the second carrier contact.

3. The packaged device according to claim 2, further comprising the carrier comprising a component attach region and the first electric component having a third component contact on the first bottom surface, wherein the third component contact is electrically connected to the component attach region of the carrier.

4. The packaged device according to claim 3, wherein the first electric component is a first transistor, wherein the first component contact is a first source contact of the first transistor, wherein the second component contact is a first gate contact of the first transistor, and wherein the third component contact is a first drain contact of the first transistor.

5. The packaged device according to claim 4, wherein the second electric component is a second transistor, wherein the second transistor comprises a second top surface and a second bottom surface, wherein a second source contact is arranged on the second bottom surface, and wherein a second drain contact and a second gate contact is arranged on the second top surface.

6. The packaged device according to claim 5, wherein the first source contact and the second source contact are electrically connected.

7. The packaged device according to claim 6, further comprising:
the carrier having a third carrier contact and a fourth carrier contact;
a second connecting element; and
a third connecting element,
wherein the second connecting element connects the second gate contact to the third carrier contact, and wherein the third connecting element connects the second drain contact to the fourth carrier contact.

8. The packaged device according to claim 3, wherein the first electric component is a first transistor, wherein the first component contact is a first drain contact of the first transistor, wherein the second component contact is a first gate contact of the first transistor, and wherein the third component contact is a first source contact of the first transistor.

9. The packaged device according to claim 8, wherein the second electric component is a second transistor, wherein the second transistor comprises a second top surface and a second bottom surface, wherein a second source contact and a second gate contact is arranged on the second bottom surface, and wherein a second drain contact is arranged on the second top surface.

10. The packaged device according to claim 9, wherein the first drain contact and the second drain contact are electrically connected.

11. The packaged device according to claim 10, further comprising the carrier having a third carrier contact and further comprising a second connecting element, wherein the second connecting element connects the second gate contact to the third carrier contact.

12. The packaged device according to claim 1, wherein the connection element comprises the second electric component embedded in a laminate material.

13. The packaged device according to claim 1, wherein the carrier further comprises a second carrier contact, wherein the first electric component comprises a second component contact on the first top surface, wherein the connection element comprises the second connection element contact on the connection element bottom surface, and wherein the second connection element contact is electrically connected to the second component contact and the second connection element contact is electrically connected to the second carrier contact.

14. A packaged semiconductor device comprising:
a leadframe comprising a first lead, a second lead, a third lead and a fourth lead;
a first semiconductor device comprising a first top surface and a first bottom surface, the first semiconductor device comprising a first device contact and a second device contact disposed on the first top surface and a third device contact disposed on the first bottom surface;
a laminated package comprising a interconnect element and a second semiconductor device, the laminated package having a top package surface and a bottom package surface, wherein a first package contact and a second package contact are disposed on the bottom package surface, and wherein a third package contact and a fourth package contact are disposed on the top package surface, the first package contact and the second package contact are connected by the interconnect element;
a first wire or conductive clip;
a second wire or conductive clip;
a third wire or conductive clip; and
an encapsulating material encapsulating the first semiconductor device,
wherein the first package contact is connected to the first lead, wherein the second package contact is connected to the first device contact, wherein the third package contact is connected to the third lead via the first wire or conductive clip, wherein the fourth package contact is connected to the fourth lead via the second wire or conductive clip, and wherein the second device contact is connected to the second lead via the third wire or conductive clip.

15. The device according to claim 14, wherein the first device contact is a first source contact, wherein the second device contact is a first gate contact, wherein the third device contact is a drain contact, wherein the second semiconductor device comprises a second source contact, a second gate contact and a second drain contact, wherein the second source contact is connected to the first package contact and the second package contact, wherein the second gate contact is connected to the third package contact, and wherein the second drain contact is connected to the fourth package contact.

16. The device according to claim 14, wherein the first semiconductor device and the second semiconductor device are power transistors.

17. The device according to claim 14, wherein the encapsulation material and the laminated package comprise a prepreg material.

* * * * *